(12) United States Patent
Yeh et al.

(10) Patent No.: US 11,508,642 B2
(45) Date of Patent: Nov. 22, 2022

(54) POWER MODULE PACKAGE STRUCTURE

(71) Applicant: AMULAIRE THERMAL TECHNOLOGY, INC., New Taipei (TW)

(72) Inventors: Tze-Yang Yeh, New Taipei (TW); Tzu-Hsuan Wang, New Taipei (TW); Ching-Ming Yang, New Taipei (TW)

(73) Assignee: AMULAIRE THERMAL TECHNOLOGY, INC., New Taipei (TW)

(*) Notice: Subject to any disclaimer, the term of this patent is extended or adjusted under 35 U.S.C. 154(b) by 86 days.

(21) Appl. No.: 17/137,363

(22) Filed: Dec. 30, 2020

(65) Prior Publication Data
US 2022/0208641 A1    Jun. 30, 2022

(51) Int. Cl.
*H01L 23/373* (2006.01)
*H01L 23/367* (2006.01)
*H01L 23/427* (2006.01)

(52) U.S. Cl.
CPC ...... *H01L 23/3735* (2013.01); *H01L 23/3677* (2013.01); *H01L 23/3736* (2013.01); *H01L 23/427* (2013.01)

(58) Field of Classification Search
CPC ............. H01L 23/3735; H01L 23/3677; H01L 23/3736; H01L 23/427
See application file for complete search history.

(56) References Cited

U.S. PATENT DOCUMENTS

| | | | | |
|---|---|---|---|---|
| 5,471,366 A | * | 11/1995 | Ozawa | H01L 23/4334 174/521 |
| 2017/0345735 A1 | * | 11/2017 | Yang | H01L 23/3735 |
| 2019/0122998 A1 | * | 4/2019 | Hino | H01L 24/29 |
| 2019/0139844 A1 | | 5/2019 | Belijar et al. | |
| 2019/0385985 A1 | * | 12/2019 | Tsuchimochi | H01L 23/49833 |

FOREIGN PATENT DOCUMENTS

| | | |
|---|---|---|
| CN | 205752150 U | 11/2016 |
| EP | 3139407 A1 | 3/2017 |
| TW | M591706 U | 3/2020 |

* cited by examiner

*Primary Examiner* — Patricia D Valenzuela
(74) *Attorney, Agent, or Firm* — Li & Cai Intellectual Property Office

(57) ABSTRACT

A power module package structure includes, from top to bottom, a layer of power chips, an upper bonding layer, a thermally-conductive and electrically-insulating composite layer, and a heat dissipation layer. The thermally-conductive and electrically-insulating composite layer contains an insulating layer and an upper copper layer that is formed on the insulating layer. One or more layers of upper packaging materials are covered over the layer of power chips and the upper bonding layer and are in contact with an upper surface of the upper copper layer. One or more layers of lower packaging materials are in contact with the insulating layer and are in contact with sidewalls of the upper copper layer. The lower packaging material has a higher rigidity than the upper packaging material.

6 Claims, 2 Drawing Sheets

POWER MODULE PACKAGE STRUCTURE

FIELD OF THE DISCLOSURE

The present disclosure relates to a power module, and more particularly to a power module package structure.

BACKGROUND OF THE DISCLOSURE

Most high-power inverters currently used in electric vehicles/hybrid vehicles use power chips, e.g., IGBT (insulated gate bipolar transistor) chips. Therefore, the heat generated by the high-power inverters during operation will cause the temperature of the power chip to rise. If no proper heat dissipation measures are incorporated, the temperature of the power chip may exceed the allowable temperature, and result in deterioration of performance and damage of the power chip. Therefore, the chip heat dissipating efficiency has become a major problem in the industry.

The direct bonded copper (DBC) substrate has become the material of choice for present chip heat dissipation structures. Referring to FIG. 1, the conventional power module mainly includes a layer 11A of power chips, an upper solder layer 12A, a DBC substrate 13A, a lower solder layer 14A, and a heat dissipation layer 15A. Among them, the DBC substrate 13A includes, from top to bottom, an upper copper layer 131A, a ceramic layer 132A, and a lower copper layer 133A. However, the thermal expansion coefficient of the upper copper layer 131A and that of the ceramic layer 132A are poorly matched, which can easily lead to cracking and poor contact due to thermal stress, thereby affecting the effectiveness of thermal conductivity.

SUMMARY OF THE DISCLOSURE

In response to the above-referenced technical inadequacies, the present disclosure provides a power module package structure that can overcome the aforementioned drawbacks.

In one aspect, the present disclosure provides a power module package structure, including a layer of power chips, an upper bonding layer, a thermally-conductive and electrically-insulating composite layer, and a heat dissipation layer. The thermally-conductive and electrically-insulating composite layer is disposed on the heat dissipation layer, the upper bonding layer is disposed on the thermally-conductive and electrically-insulating composite layer, and the layer of power chips is disposed on the upper bonding layer. The thermally-conductive and electrically-insulating composite layer contains an insulating layer and an upper copper layer that is formed on the insulating layer. One or more layers of upper packaging materials are covered over the layer of power chips and the upper bonding layer and are in contact with an upper surface of the upper copper layer. One or more layers of lower packaging materials are in contact with the insulating layer and are in contact with sidewalls of the upper copper layer. The lower packaging material has a higher rigidity than the upper packaging material.

In certain embodiments, a hardness of the lower packaging material is higher than that of the upper packaging material, a tensile strength of the lower packaging material is higher than that of the upper packaging material, and a compressibility of the lower packaging material is lower than that of the upper packaging material.

In certain embodiments, the upper packaging material is one of a silicone-based material or an elasto-plastic material.

In certain embodiments, the upper packaging material has a thickness of about 5 mm to 20 mm.

In certain embodiments, the lower packaging material is one of a rigid resin or a rigid plastic.

In certain embodiments, the lower packaging material has a thickness of about 1 mm to 5 mm.

In certain embodiments, the insulating layer is made of a ceramic material.

In certain embodiments, the ceramic material is at least one selected from aluminum oxide, aluminum nitride, and silicon nitride.

In certain embodiments, the insulating layer is one of an epoxy-based composite, a polyimide-based composite, or a polypropylene-based composite.

In certain embodiments, the insulating layer includes a filler, and the filler is at least one selected from alumina, aluminum nitride, silicon nitride, silicon carbide, and boron nitride.

In certain embodiments, the upper copper layer has a thickness of about 0.1 mm to 4 mm.

One of the advantages of the present disclosure is that the power module package structure can achieve water-proof and moisture-proof protection and increase electrical insulation, by virtue of "one or more layers of upper packaging materials are covered over the layer of power chips and the upper bonding layer and are in contact with the upper surface of the upper copper layer", "one or more layers of lower packaging materials are in contact with the insulating layer", and "the lower packaging material has a higher rigidity than the upper packaging material", while effectively reducing the occurrence of issues such as cracking and poor contact caused by mismatched thermal expansion coefficients.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
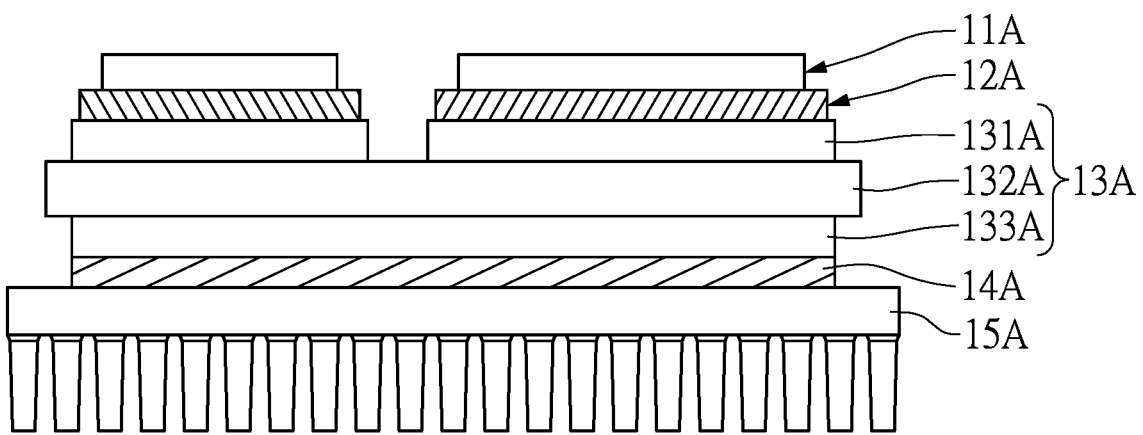
FIG. 1 is a side schematic view illustrating a conventional power module.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
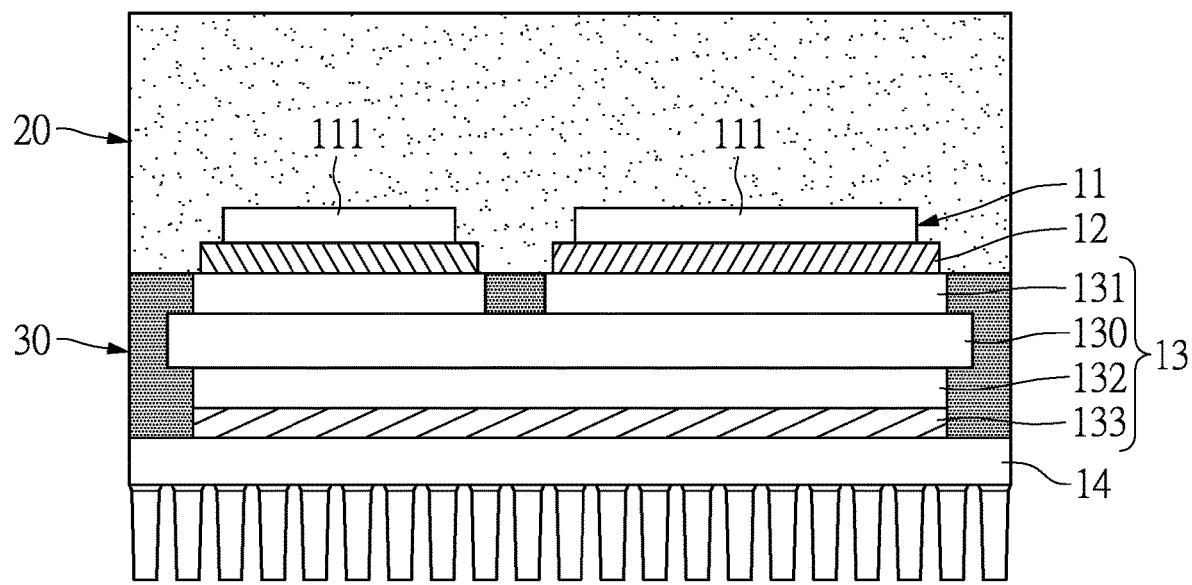
FIG. 2 is a side schematic view illustrating a power module package structure of the present disclosure.

Referring to FIG. 2, the present disclosure provides a power module package structure. As shown in FIG. 2, the power module package structure of the present disclosure includes, from top to bottom, a layer 11 of power chips 111, an upper bonding layer 12, a thermally-conductive and electrically-insulating composite layer 13, and a heat dissipation layer 14.

The thermally-conductive and electrically-insulating composite layer 13 is disposed on the heat dissipation layer 14. The heat dissipation layer 14 can be an aluminum heat sink, a water-cooling heat dissipation device, or a metal plate with a heat dissipation function, but is not limited thereto.

In addition, the thermally-conductive and electrically-insulating composite layer 13 contains an insulating layer 130 and an upper copper layer 131 that is formed on the insulating layer 130. In this embodiment, the thermally-conductive and electrically-insulating composite layer 13 also contains a lower copper layer 132 that is formed under the insulating layer 130, and a lower bonding layer 133 that is formed under the lower copper layer 132. However, in other embodiments, the thermally-conductive and electrically-insulating composite layer 13 may not contain the lower copper layer 132 and the lower bonding layer 133.

Further, the insulating layer 130 of the embodiment can be made of a ceramic material. The ceramic material can be aluminum oxide, but it can also be selected from aluminum nitride and silicon nitride. The upper copper layer 131 and the heat dissipation layer 14 can form insulation through the insulating layer 130, and the upper copper layer 131 can conduct heat to the heat dissipation layer 14 through the insulating layer 130. Furthermore, the upper copper layer 131 can be composed of thick copper to increase uniformity of heat dissipation and efficiency of overall heat conduction.

The upper bonding layer 12 is disposed on the thermally-conductive and electrically-insulating composite layer 13, that is, on the upper copper layer 131 of the thermally-conductive and electrically-insulating composite layer 13. The upper bonding layer 12 can be a tin bonding layer, but it can also be a sintered silver layer. The layer 11 of power chips 111 can include one or more power chips 111, and one of the power chips 111 can be replaced with a diode chip. In addition, the one or more power chips 111 are bonded onto the upper copper layer 131 through the upper bonding layer 12. The heat generated by the one or more power chips 111 can be conducted to the heat dissipation layer 14 by the upper copper layer 131 to be dissipated outward.

One or more layers of upper packaging materials 20 are covered over the layer 11 of power chips 111 and the upper bonding layer 12 and are in contact with an upper surface of the upper copper layer 131.

One or more layers lower packaging materials 30 are in contact with sidewalls of the insulating layer 130 as well as sidewalls of the upper copper layer 131. That is, one or more layers of the lower packaging materials 30 can wrap around the insulating layer 130 and the upper copper layer 131, and one or more layers of the lower packaging materials 30 are in contact with the sidewalls of the insulating layer 130 and the sidewalls of the upper copper layer 131. Also, the rigidity of the lower packaging material 30 is higher than that of the upper packaging material 20. Furthermore, the hardness of the lower packaging material 30 is higher than that of the upper packaging material 20, the tensile strength of the lower packaging material 30 is higher than that of the upper packaging material 20, and the compressibility of the lower packaging material 30 is lower than that of the upper packaging material 20.

Moreover, the upper packaging material 20 can be one of a silicone-based material or an elasto-plastic material, and the thickness of the upper packaging material 20 can be 5 mm to 20 mm to provide waterproof and moisture-proof protection as well as increasing electrical insulation. The lower packaging material 30 can be one of a rigid resin or a rigid plastic, and the thickness of the lower packaging material 30 can be 1 mm to 5 mm to greatly reduce occurrence of issues such as cracking and poor contact caused by mismatched thermal expansion coefficient between the upper copper layer 131 and the insulating layer 130.

In this embodiment, the lower packaging material 30 is also in contact with the sidewalls of the lower copper layer 132, the sidewalls of the lower bonding layer 133, and the upper surface of the heat dissipation layer 14, so as to avoid cracking caused by the mismatched thermal expansion coefficients between the lower copper layer 132 and the heat dissipation layer 14.

Figure 3:
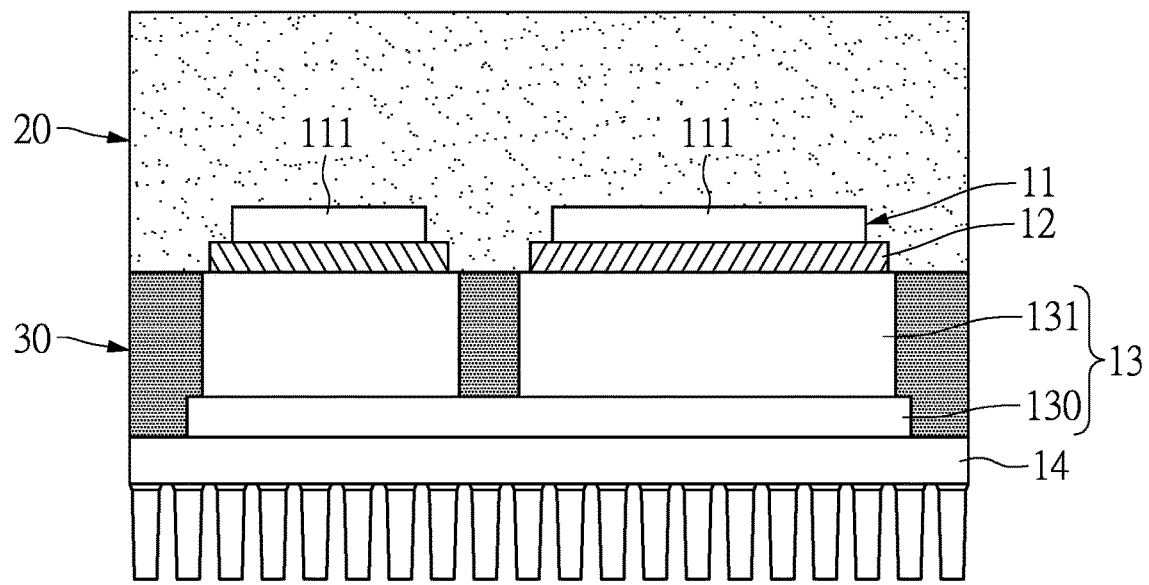
FIG. 3 is a side schematic view illustrating another power module package structure of the present disclosure.

Referring to FIG. 3, the present disclosure provides another power module package structure. As shown in FIG. 3, the power module package structure of the present disclosure includes, from top to bottom, a layer 11 of power chips 111, an upper bonding layer 12, a thermally-conductive and electrically-insulating composite layer 13, and a heat dissipation layer 14.

The thermally-conductive and electrically-insulating composite layer 13 is disposed on the heat dissipation layer 14. The upper bonding layer 12 is disposed on the thermally-conductive and electrically-insulating composite layer 13. The layer 11 of power chips 111 is disposed on the upper bonding layer 12. Further, the thermally-conductive and electrically-insulating composite layer 13 contains an insulating layer 130 and an upper copper layer 131 that is formed on the insulating layer 130. Furthermore, the thickness of the upper copper layer 131 can be 0.1 mm to 4 mm to significantly increase uniformity of the heat dissipation and efficiency of the overall heat conduction.

In this embodiment, the insulating layer 130 can be a polymer composite. Further, the insulating layer 130 can be an epoxy-based composite. Furthermore, the insulating layer 130 includes at least one of the following fillers: alumina, aluminum nitride, silicon nitride, silicon carbide, or boron nitride. In other embodiments, the insulating layer 130 can be a polyimide-based composite or a polypropylene-based composite.

One or more layers of upper packaging materials 20 are covered over the layer 11 of power chips 111 and the upper bonding layer 12 and are in contact with an upper surface of the upper copper layer 131.

One or more layers of lower packaging materials 30 are in contact with sidewalls of the insulating layer 130, sidewalls of the upper copper layer 131, and an upper surface of the heat dissipation layer 14. That is, one or more layers of lower packaging materials 30 can wrap around the insulating layer 130 and the upper copper layer 131, and one or more layers of the lower packaging materials are in contact with the sidewalls of the insulating layer 130, the sidewalls of the upper copper layer 131, and the upper surface of the heat dissipation layer 14. In this embodiment, the rigidity of the lower packaging material 30 is higher than that of the upper packaging material 20. Furthermore, the hardness of the lower packaging material 30 is higher than that of the upper packaging material 20, the tensile strength of the lower packaging material 30 is higher than that of the upper packaging material 20, and the compressibility of the lower packaging material 30 is lower than that of the upper packaging material 20.

In this embodiment, the upper packaging material 20 can also be one of a silicone-based material or an elasto-plastic material, and the thickness of the upper packaging material 20 can be 5 mm to 20 mm to provide waterproof and moisture-proof protection as well as increasing electrical insulation. The lower packaging material 30 can also be one of a rigid resin or a rigid plastic, and the thickness of the lower packaging material 30 can be 1 mm to 5 mm to greatly reduce occurrence of issues such as cracking and poor contact caused by mismatched thermal expansion coefficient between the upper copper layer 131, the insulating layer 130, and the heat dissipation layer 14.

In conclusion, the power module package structure of the present disclosure can achieve water-proof and moisture-proof protection and increase electrical insulation, by virtue of "one or more layers of upper packaging materials are covered over the layer of power chips and the upper bonding layer and are in contact with the upper surface of the upper copper layer", "one or more layers of lower packaging materials are in contact with the insulating layer", and "the lower packaging material has a higher rigidity than the upper packaging material", while effectively reducing the occurrence of issues such as cracking and poor contact caused by mismatched thermal expansion coefficients.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module package structure, comprising: a layer of power chips, an upper bonding layer, a thermally-conductive and electrically-insulating composite layer, and a heat dissipation layer; wherein the thermally-conductive and electrically-insulating composite layer is disposed on the heat dissipation layer, the upper bonding layer is disposed on the thermally-conductive and electrically-insulating composite layer, and the layer of power chips is disposed on the upper bonding layer; wherein the thermally-conductive and electrically-insulating composite layer contains an insulating layer and an upper copper layer that is formed on the insulating layer; wherein one or more layers of upper packaging materials are covered over the layer of power chips and the upper bonding layer and are in contact with an upper surface of the upper copper layer, and one or more layers of lower packaging materials are in contact with the insulating layer; wherein the lower packaging material has a higher rigidity than the upper packaging material; wherein the upper packaging material is made of a silicone-based material, the lower packaging material is made of a rigid resin, and the insulating layer is made of a ceramic material; wherein a thermal expansion coefficient of the upper copper layer is greater than that of the insulating layer such that they are mismatched; wherein the one or more layers of lower packaging materials wrap around the upper copper layer and the insulating layer, and are in contact with the heat dissipation layer, so as to avoid cracking caused by the mismatched thermal expansion coefficients of the upper copper layer and the insulating layer.

2. The power module package structure according to claim 1, wherein a hardness of the lower packaging material is higher than that of the upper packaging material, a tensile strength of the lower packaging material is higher than that of the upper packaging material, and a compressibility of the lower packaging material is lower than that of the upper packaging material.

3. The power module package structure according to claim 1, wherein the upper packaging material has a thickness of 5 mm to 20 mm.

4. The power module package structure according to claim 1, wherein the lower packaging material has a thickness of 1 mm to 5 mm.

5. The power module package structure according to claim 1, wherein the ceramic material is at least one selected from aluminum oxide, aluminum nitride and silicon nitride.

6. The power module package structure according to claim 1, wherein the upper copper layer has a thickness of 0.1 mm to 4 mm.

\* \* \* \* \*